(12) United States Patent
Marshall et al.

(10) Patent No.: US 6,972,590 B2
(45) Date of Patent: Dec. 6, 2005

(54) DATA BUS WITH SEPARATE MATCHED LINE IMPEDANCES AND METHOD OF MATCHING LINE IMPEDANCES

(75) Inventors: David Marshall, Fort Collins, CO (US); Karl J. Bois, Fort Collins, CO (US); Elias Gedamu, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 703 days.

(21) Appl. No.: 10/157,496

(22) Filed: May 30, 2002

(65) Prior Publication Data

US 2003/0221863 A1 Dec. 4, 2003

(51) Int. Cl.[7] ............................................. H03K 17/16
(52) U.S. Cl. ............................. 326/30; 326/82; 326/93
(58) Field of Search ............................... 326/26, 27, 30, 326/82–89, 93–98

(56) References Cited

U.S. PATENT DOCUMENTS

| | | | |
|---|---|---|---|
| 4,450,370 A | * | 5/1984 | Davis ........................... 326/30 |
| 5,025,412 A | | 6/1991 | Dalrymple et al. |
| 5,550,804 A | | 8/1996 | Haussler et al. |
| 6,118,350 A | | 9/2000 | Gupta et al. |
| 6,141,765 A | | 10/2000 | Sherman |
| 6,177,807 B1 | * | 1/2001 | Bertin et al. .................. 326/30 |
| 6,338,635 B1 | | 1/2002 | Lee |
| 6,392,446 B1 | | 5/2002 | Reasoner et al. |
| 6,480,020 B1 | * | 11/2002 | Jung et al. .................... 326/30 |

* cited by examiner

*Primary Examiner*—Don Le

(57) ABSTRACT

A data bus for a printed circuit board is disclosed having a plurality of lines separated by a substrate. A method is also disclosed for creating a bus with a reduced reflection of signal energy at the interface between the bus and a receiving agent connected to the bus. The lines in the bus include data lines and at least two strobe lines that are positioned adjacent each other to take advantage of the known impedance inherent to their dominant coupling. The bus includes separate data-line terminations and strobe-line terminations connected to the data lines and strobe lines, respectively. The separate terminations have values matched to impedances calculated from the separate sets of lines to more effectively reduce the reflected energy by more accurately matching the impedances on the lines.

23 Claims, 6 Drawing Sheets

DATA BUS WITH SEPARATE MATCHED LINE IMPEDANCES AND METHOD OF MATCHING LINE IMPEDANCES

TECHNICAL FIELD

The technical field relates generally to buses on printed circuit boards. More particularly, the technical field relates to the positioning of transmission lines within buses and the matching of transmission line impedances.

BACKGROUND

In the field of printed circuit board design, lines (also referred to as transmission lines or traces), carry signals between components. A component sending the signal may be referred to as a "sending agent" and a component receiving the signal may be referred to as a "receiving agent." A group of lines connecting the same components is referred to as a "bus." A bus may be bi-directional, such that a component may be a sending agent at one moment and a receiving agent at another moment. In addition to lines carrying data, a bus using a source-synchronous signal may also include two or more strobe signals that transition from a high state to a low state, and vice-versa, opposite each other. By way of example, a bus carrying eight bits of information might include two strobe lines, eight data lines carrying data, and one line used for an error-correction bit, for a total of eleven lines.

In a typical bus on a circuit board, the lines may be disposed in a horizontal plane, separated by a non-conducting substrate. The plane of lines is often sandwiched between conducting planes carrying either a ground signal or a source signal. These conducting planes aid in minimizing noise on the lines. The conducting planes are also disposed in the substrate and are separated from the lines by the substrate. Each line has an intrinsic impedance, which is typically designed to meet some specification. Impedance is the resistance seen by a wavefront of a signal propagating down a transmission line. The impedance value is based on the type of material of the line, the width and height of the line, and the material surrounding the line. Signal transitions on neighboring lines create changes in the impedance of the "victim" line. For neighboring lines, a signal transition on one line creates a change of impedance on the other neighboring lines. This impedance is a function of distances between lines and is therefore most pronounced between lines that are physically close to each other, such as the adjacent lines in the example of a plane of lines. Lines having a strong effect on the impedance of each other, such as adjacent lines in a plane, are referred to as "dominantly-coupled lines."

As between signals on two adjacent lines, three situations exist for impedance created by signal transition. "Natural mode" refers to a situation in which the signal on one line transitions while the signal on the adjacent line remains the same. "Odd mode" refers to a situation in which signals on adjacent lines transition at the same time, opposite each other; e.g., one goes high while the other line goes low. "Even mode" refers to a situation in which signals on adjacent lines transition at the same time in the same direction; e.g., both lines transition from low to high at the same time. The impedances can be calculated for each mode of operation. In general, the impedance of the victim line is the intrinsic impedance in natural mode, which is less than the intrinsic impedance in the odd mode, and is greater than the intrinsic impedance in the even mode.

Typically, the ends of the transmission lines of a circuit board bus are terminated to a supply having a resistance equivalent to the impedance of the line being terminated. Imperfect matching of the impedance and the termination resistance creates an unwanted reflection signal from the receiving agent back to the sending agent, which results in wasted energy. The reflection coefficient is given by the formula, Reflection Coefficient= $(Z_2-Z_1)/(Z_2+Z_1)$, where $Z_2$ is the impedance of the medium toward which the signal is traveling, i.e., the receiving agent, and $Z_1$ is the impedance of the medium from which the signal was traveling, i.e., the lines in the bus.

For convenience, existing systems use a matched impedance value for all lines, with the matched impedance value based on an average impedance value for all lines. The lines, including strobe lines, are generally positioned randomly throughout the plane of lines with the expectation that the impedance value calculated based on line averages using random line positioning is close to the lines' actual impedances. Strobe lines come in pairs, and carry signals that transition in a known or predictable manner. Often, strobe lines are source-synchronous and the signals on the strobe lines are generally out of phase with one another; that is, the signals are generally in the odd mode. Because strobe lines behave differently than data lines, some existing designs position strobe lines at opposite sides of the planes of lines or otherwise space the strobes apart from each other to minimize the strobe lines' impact on impedance. Existing buses position other lines, such as data lines, more or less randomly throughout the bus. Using random line positioning and calculating a single matched impedance value is necessarily subject to errors because the actual impedance of individual lines may vary from the calculated average. Because of these variations, the interface between the lines and the receiving agent still has some significant signal reflection, notwithstanding the use of the termination to try to minimize this reflection.

To minimize reflections and to reduce the error necessarily associated with averaging all impedances, existing systems use conducting planes above and below the planes of lines. The use of conducting planes minimizes the effect of lines from adjacent planes. However, some bus designs use multiple planes of lines stacked on top of each other. In these bus designs, inserting a conducting plane between each plane of lines requires considerable space on the circuit board.

SUMMARY

A data bus is disclosed with separate terminations matched to impedances of the lines in the bus. The data bus has a plurality of lines, including data lines and strobe lines, separated by a substrate. The data bus has separate strobe-line terminations and data-line terminations. The strobe-line terminations are connected to each of the strobe lines, and separate data-line terminations are connected to each of the data lines. The terminations are matched to impedances calculated from the strobe lines and data lines, respectively.

A method is also disclosed for matching impedances of lines in a data bus having strobe lines and data lines. Strobe lines are positioned adjacent each other so that they are dominantly coupled to each other. Strobe-line terminations are connected to each of the strobe lines, and separate data-line terminations are connected to each of the data lines.

A data bus is also disclosed having at least two parallel conducting planes and a plane of transmission lines disposed there between. The lines include strobe lines and data lines. The strobe lines include two source-synchronous strobe lines that transition opposite each other, operating generally in the odd mode. The strobe lines are positioned adjacent each other to take advantage of the known signal transitioning pattern on the strobe lines. Strobe-line terminations are connected to the strobe lines and have values matched to an impedance of the strobe lines. Separate data-line terminations are connected to the data lines and have impedance values matched to an impedance of the data lines.

An integrated circuit chip is also disclosed having separate data-line and strobe-line terminations adapted to receive signals from a data bus at data- and strobe-line inputs. The terminations are matched to the data-line and strobe-line impedances, respectively, to reduce the reflection of energy at the interface between the bus and the integrated circuit.

DESCRIPTION OF THE DRAWINGS

The detailed description will refer to the following drawings, wherein like numerals refer to like elements, and wherein.

DETAILED DESCRIPTION

Figure 1:
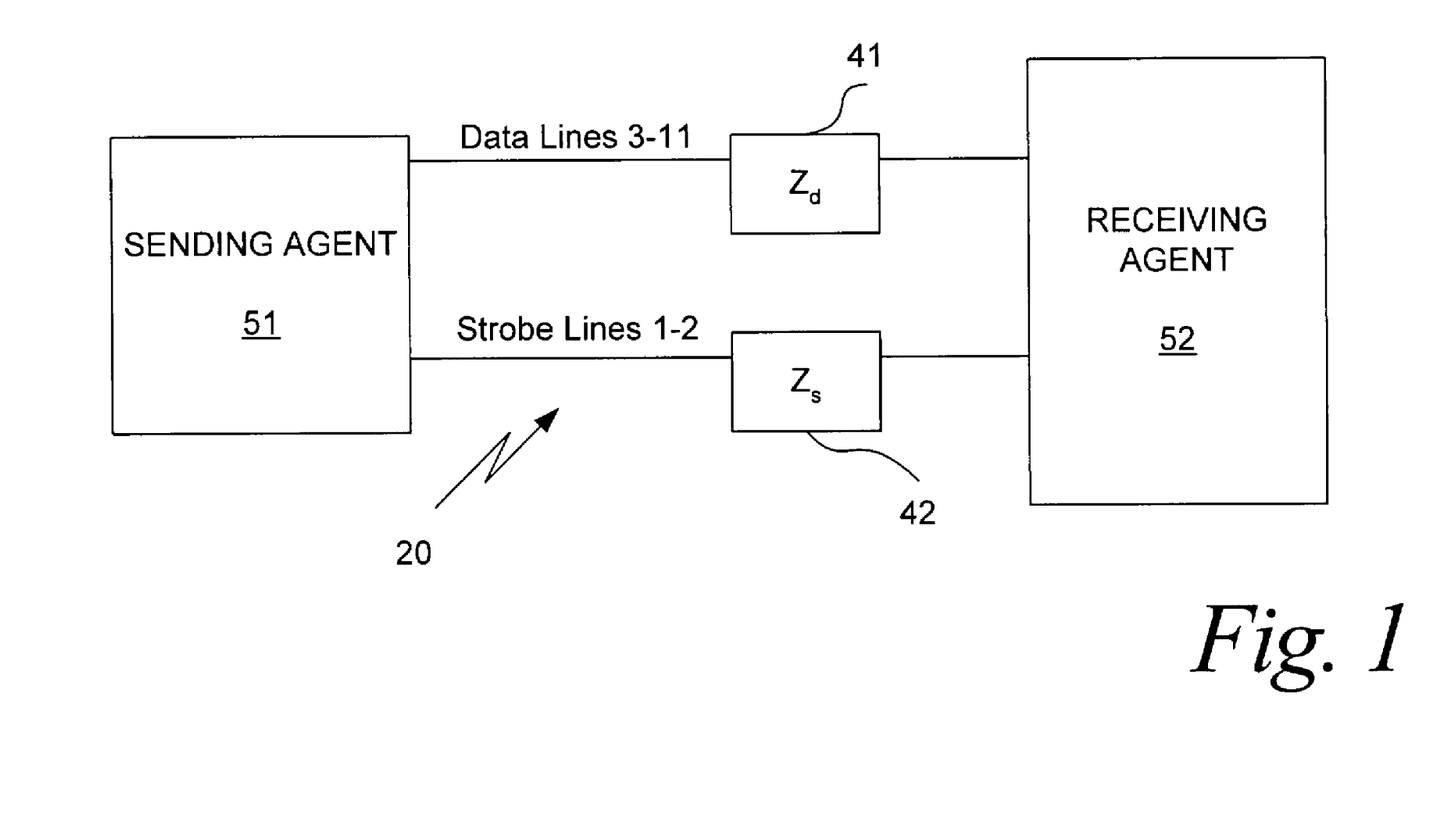
FIG. 1 shows a block diagram of a bus connected to a sending agent and receiving agent.

FIG. 1 shows a block diagram of a bus 20 connected to a sending agent 51 and a receiving agent 52. As used herein, "receiving agent" and "sending agent" refer to any component that receives or sends data over the bus 20. The receiving agent 52 and sending agent 51 may include, for example, processors, logic gates, or other integrated circuit chips. In a bi-directional bus, the same device may be a sending agent at one instant and a receiving agent at another instant. As used herein "strobe lines" refer to any lines that carry signals that transition in a known manner, such as signals that transition periodically, for example. In one embodiment, the strobe lines include at least one pair of lines carrying complementary source-synchronous signals that transition opposite each other at regular intervals. As used herein, "data lines" refer to all other lines, including lines carrying bits of data as well as lines carrying error-correction information.

The bus 20 shown in FIG. 1 includes strobe lines 1, 2 and data lines 3–11. Separate terminations 41, 42 are connected to the data lines 3–11 and the strobe lines 1, 2, as indicated by $Z_d$ and $Z_s$, respectively. Signals on the strobe lines 1, 2 are dominantly coupled, because the strobe lines 1, 2 are positioned adjacent each other. The signals carried on strobe lines 1, 2 transition in a known manner relative to each other, by definition. Strobe signals transitioning opposite each other, such that one signal transitions from high to low, while the other signal transitions from low to high, are always in the odd mode. The impedance between strobe lines 1, 2 is different than the impedance between the data lines 3–11, which may transition depending upon the data being transmitted. The design shown in FIG. 1 takes advantage of this known dominant coupling between adjacent strobe lines 1, 2 by creating a separate strobe-line termination 42. As used herein, a "termination" refers to any device that matches an impedance of a transmission line to prevent or minimize reflection of energy back to into the transmission line. A termination includes, for example, a resistor. In an embodiment, the terminations 41, 42 are a separate components connected to the bus 20. For example, the terminations 41, 42 may be positioned at an end of the bus 20, near a receiving agent 52 as shown in FIG. 1. In another embodiment, the terminations 41, 42 may be internal to the receiving agent 52. The terminations 41, 42 may have impedance values that can be adjusted. For example, the impedance values may be adjusted using a software interface in the case in which the termination is internal to the receiving agent 52.

In one embodiment in which adjacent strobe lines 1, 2 carry complementary source-synchronous signals, the strobe-line terminations 42 are given a value calculated based on the odd mode impedance value of the strobe lines 1, 2. In another embodiment, the strobe-line terminations 42 have impedance values matched to a geometric mean impedance of the strobe lines 1, 2, which may be approximately equal to the odd mode impedance, depending upon the functionality of the bus 20. Unlike the signals carried on the strobe lines 1, 2, the signals on the data lines 3–11 do not transition in a known manner. The signals on the data lines 3–11 may therefore be in the odd mode, the even mode, or the natural mode at any given instant. In one embodiment, the separate data-line termination 41 has an impedance value matched to the geometric average impedance of the data lines 3–11, namely the intrinsic impedance.

If the bus 20 is bi-directional, the impedance value of the strobe lines 1, 2 will return to the intrinsic impedance values at the moment when the data flow changes direction. This discontinuity may be factored into the value of the strobe-line termination 42, or the design may otherwise accommodate the discontinuity, for example with a delay in processing the data while the discontinuity progresses through the lines 1–11. In one embodiment, the strobe-line terminations 42 in bi-directional buses have a value based on the average of the odd mode and natural mode impedance values of the lines 3–11 to compensate for the discontinuity. In another embodiment, systems using bi-directional buses 20 may use the odd mode impedance value and ignore the discontinuity in the value of the strobe-line termination 42.

Figure 2:
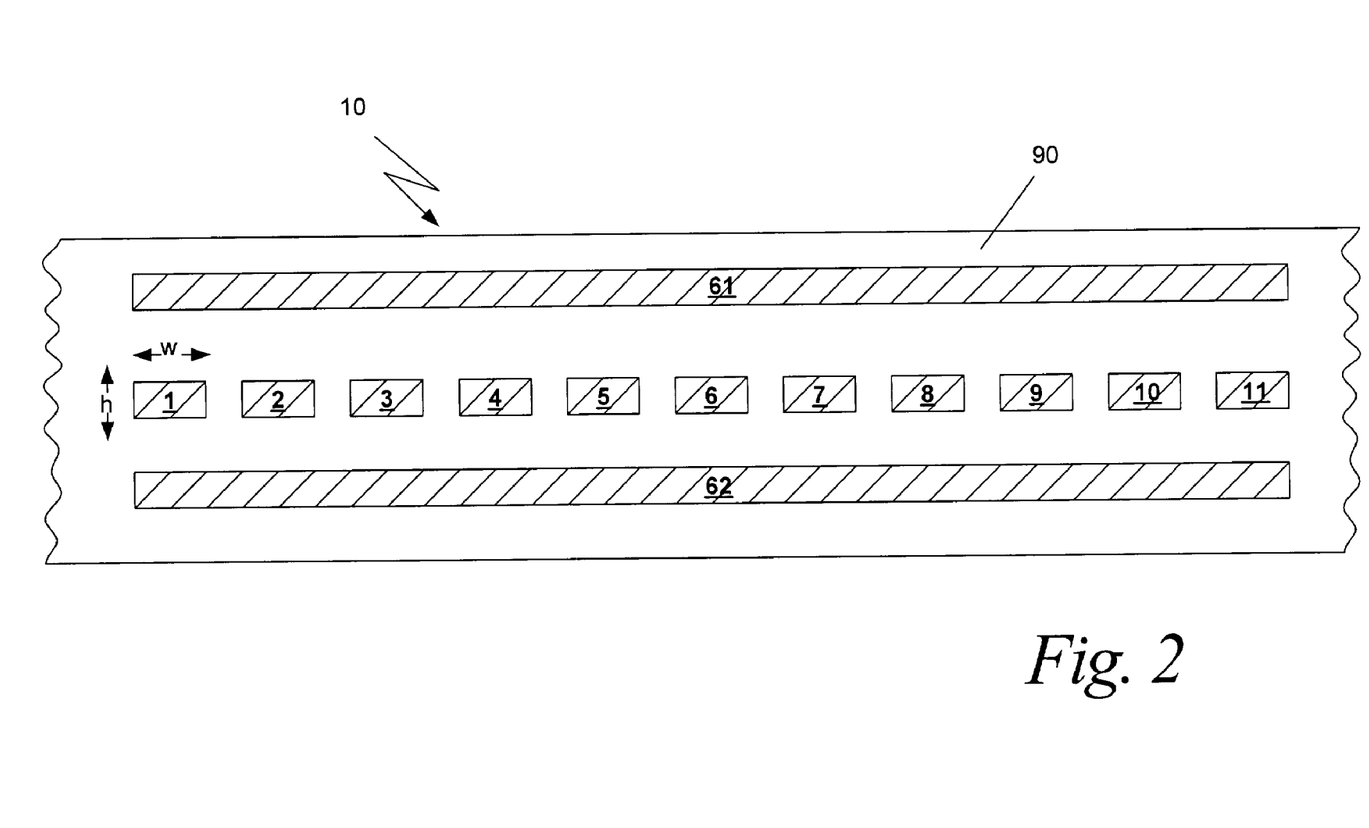
FIG. 2 is cross-section of the data bus shown in FIG. 1, disposed in a circuit board.

FIG. 2 is cross-section of the data bus 20 (see FIG. 1) disposed in a printed circuit board 10. The bus 20 includes first and second conducting planes 61, 62 that surround the plane of lines 1–11. The conducting planes 61, 62 may carry a ground or a source signal. In the example shown in FIG. 2, the plane of lines 1–11 extends generally the width of the conducting planes 61, 62, and the strobe lines 1, 2 are positioned at one side of the plane of lines 1–11, such that only the data line 3 is adjacent, and therefore dominantly coupled to, the strobe line 2. The lines 1–11 are separated from each other and from the conducting planes 61, 62 by a non-conducting substrate. In the example shown in FIG. 2, the lines 1–11 have a generally rectangular cross-section, with a width (w) slightly greater than height (h). This configuration of adjacent strobe lines 1, 2 creates more electrical cross-talk between signals on the strobe lines 1, 2 than do existing methods of spacing the strobe lines 1, 2 apart. The increased cross-talk is used as a benefit to matching impedances with separate data-line and strobe-line terminations 41, 42.

Figure 3:
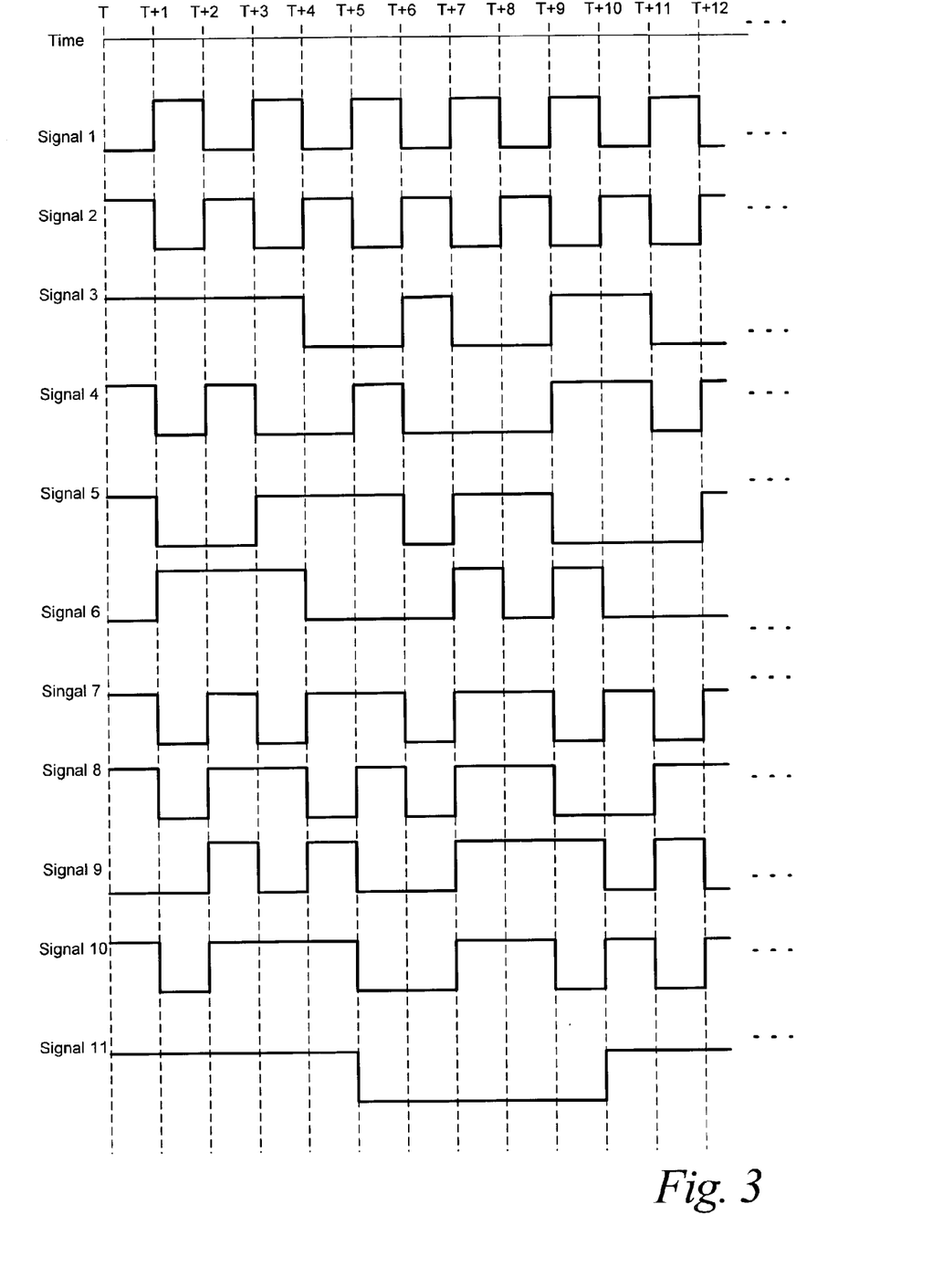
FIG. 3 is an example of wave forms for the lines in the bus shown in FIGS. 1 and 2.

FIG. 3 shows example wave forms for the lines 1–11 for times t to t+12, where t refers to one clock cycle. The signals on the strobe lines 1, 2 transition opposite each other each clock cycle, while the signals on the data lines 3–11 transition according to the data being transmitted. The bottommost signal (line 11) is an error-correction signal in this example. The signal of the error correction line 11 might transition less often than other data lines 3–10. FIG. 3 illustrates various transition modes between adjacent lines 1–11. For example, adjacent lines 4 and 5 are in odd mode relative to each other at time t+3, in natural mode at time t+5, and in even mode at time t+6. Because the strobe lines 1, 2 are adjacent each other, the strobe lines 1, 2 are always in odd mode relative to each other in this example. By positioning the strobe lines 1, 2 adjacent each other in the bus layout, the effect of the strobe lines 1, 2 on the data lines 3–11 is minimized while the effect of the strobe lines 1, 2 on each other is magnified in a known manner. Separate matched impedance values $Z_s$, $Z_d$ can then be calculated and applied to the strobe lines 1, 2 and the data lines 3–11. As a result, the separate terminations 41, 42 more accurately estimate the line impedances than a single termination value would.

Figure 4:
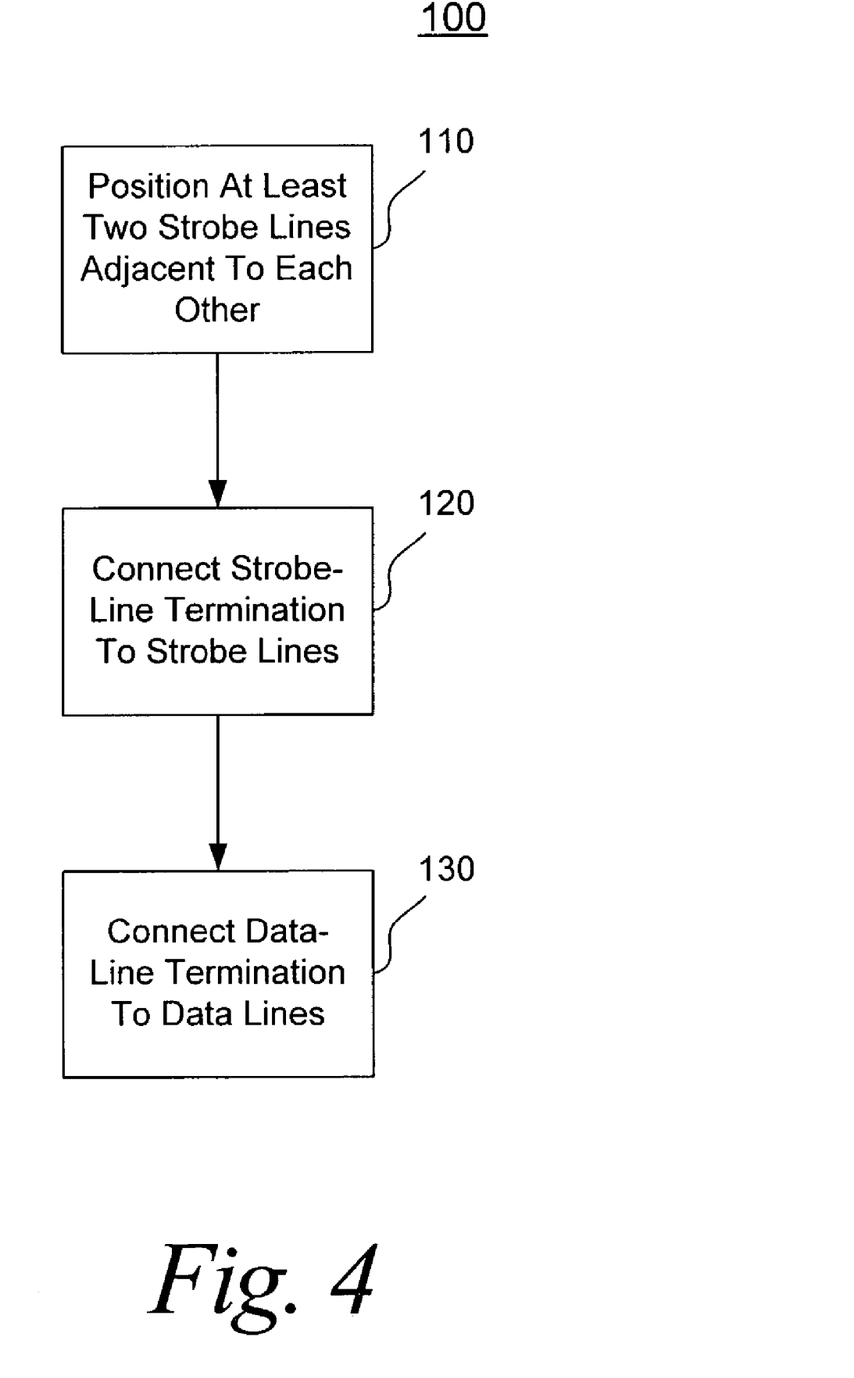
FIG. 4 is a flow chart of a method for creating a data bus with strobe-line and data-line terminations, as described in the preceding Figures.

FIG. 4 is a flow chart of a method 100 for creating a data bus 20 with strobe-line and data-line terminations 41, 42, as described in the preceding figures. The strobe lines 1, 2 are positioned 110 adjacent each other in the design. A strobe-line termination 42 is connected 120 to each of the strobe lines 1, 2. The strobe-line termination 42 has an impedance value based on the value of the impedance created by the adjacent strobe lines 1, 2. A separate data-line termination 41 is connected 130 to each of the data lines 3–11. The data-line termination 41 has an impedance value based on the impedance created by adjacent data lines 3–11 and may be, for example, an average impedance expected on the data lines 3–11 based on design simulations, or simply the intrinsic impedance.

Figure 5:
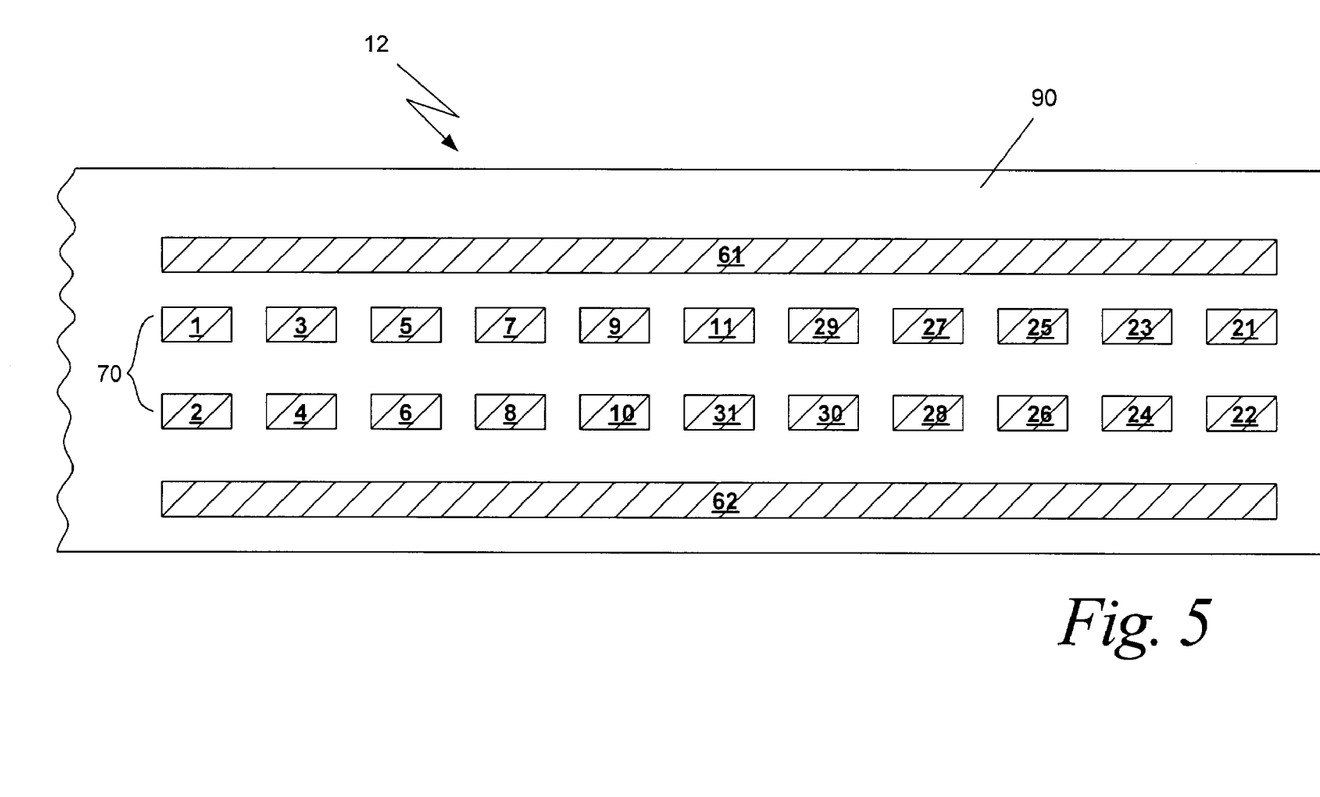
FIG. 5 is a cross-section of an alternative embodiment of a bus disposed in a printed circuit board.

FIG. 5 is a cross-section of an alternative embodiment of a data bus 70 having two planes of lines 1–11, 21–31 disposed in a circuit board 12 between conducting planes 61, 62. In this embodiment, the planes of lines 1–11, 21–31 for two sets of 8 bits of data are positioned laterally to each other. The strobe lines 1, 2 and 21, 22 are placed on top of each other at either side of the planes. In this configuration, the strobe lines 1, 2 and 21, 22 are dominantly-coupled in respective pairs, but have the least possible effect on other lines because the pairs of strobe lines 1, 2 and 21, 22 are positioned near the sides of the bus 70. Reducing the reflection by better matching the impedances of the terminations 41, 42 allows the stacking of planes of lines 1–11, 21–31 without separation by a conducting plane, e.g., 61, 62, which decreases the physical size of the bus 20. In an alternative embodiment in which planes of lines 1–11, 21–31 are adjacent each other similar to the embodiment shown in FIG. 5, all of the strobe lines 1, 2, 21, 22 are positioned next to each other in the two planes. For example, strobe lines 1, 2, 21, 22 might be placed where the left-most lines 1, 2, 3, 4 are shown in FIG. 5.

Figure 6:
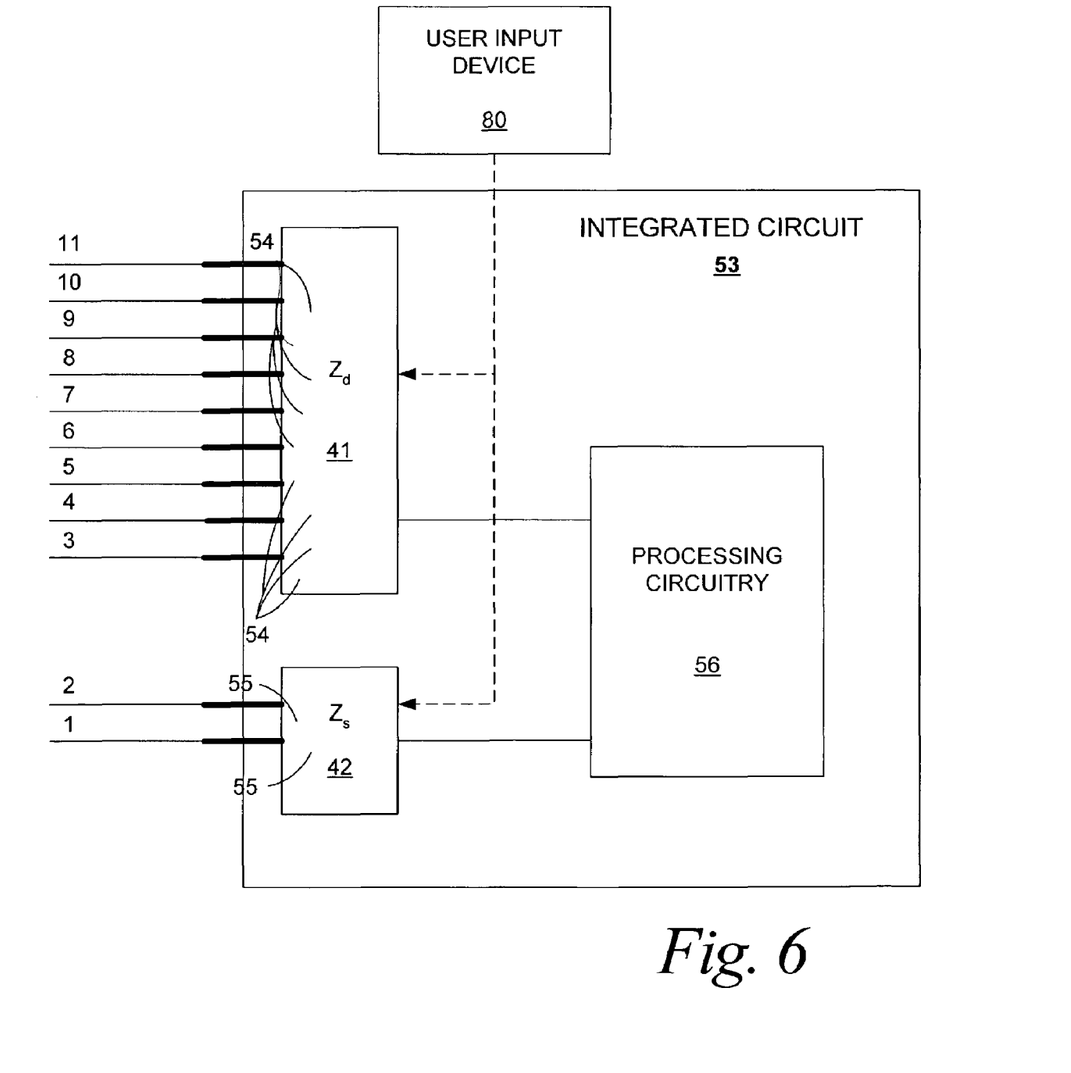
FIG. 6 shows an alternative embodiment in which the terminations are internal to an integrated circuit that acts as a receiving agent.

FIG. 6 shows an alternative embodiment in which the terminations 41, 42 are internal to an integrated circuit 53, which acts as a receiving agent. The integrated circuit 53 has data-line inputs 54 that receive signals from the data lines 3–11 of the bus 20 and strobe-line inputs 55 that receive signals from the strobe lines 1–2. The signals from the lines 1–11 are processed by processing circuitry 56 of the integrated circuit 53. At the junction where the lines 1–11 connect to the integrated circuit 53, separate data-line terminations 41 and strobe-line terminations 42 connect to the lines 1–11 to reduce the reflection of signals on the lines 1–11 as the signals transition from the media of the lines 1–11 to that of the circuit 53. In the example of FIG. 6, the impedance values of the terminations 41, 42 may be adjusted using a user input device 80 that interfaces with the circuit 53.

Although the present invention has been described with respect to particular embodiments thereof, variations are possible. For example, although the system is illustrated in connection with buses having two strobe lines and nine data lines, one skilled in the art will recognize that it may be implemented in systems having any number of strobe and data lines. Also, although the system is described with respect to pairs of strobe lines in source-synchronous systems transitioning opposite each other at regular intervals, one skilled in the art will recognize that the same system and method apply to any data bus carrying lines of data that are dominantly coupled. The present invention may be embodied in specific forms without departing from the essential spirit or attributes thereof. It is desired that the embodiments described herein be considered in all respects illustrative and not restrictive and that reference be made to the appended claims and their equivalents for determining the scope of the invention.

What is claimed is:

1. A data bus with separate matched line impedances, comprising:
   a plurality of lines separated by a substrate, wherein the lines include one or more data lines and at least two strobe lines located adjacent each other;
   a data-line termination connected to each of the data lines comprising a value matched to an impedance of the data lines; and
   a strobe-line termination connected to each of the strobe lines comprising a value matched to an impedance of the strobe lines.

2. The bus of claim 1, wherein the plurality of lines are disposed in a horizontal plane.

3. The bus of claim 2, further comprising a conducting plane adjacent the horizontal plane of lines, which conducting plane is connected to a source or ground.

4. The bus of claim 1, wherein the data-line terminations and the strobe-line terminations are separate components connected to the respective lines proximate ends of the lines.

5. The bus of claim 1, further comprising a receiving agent connected to the lines, wherein at least one of the data-line terminations and the strobe-line terminations is internal to the receiving agent.

6. The bus of claim 1, wherein the impedance values of the data-line termination and the strobe-line terminations are adjustable.

7. The bus of claim 1,
   wherein the at least two strobe lines include a pair of source-synchronous strobe lines adjacent to each other that periodically transition opposite each other, whereby the source-synchronous strobe lines operate in odd mode relative to each other; and
   wherein the strobe-line terminations have a value calculated using an odd mode impedance for the source-synchronous strobe lines.

8. The bus of claim 1,
   wherein the lines carry signals in more than one direction;
   wherein the strobe signals transition opposite each other periodically; and
   wherein the strobe-line termination has a value calculated based on an average of an odd-mode impedance and a natural-mode impedance of the strobe lines.

9. The bus of claim 1,
wherein the plurality of lines includes two or more parallel planes of lines disposed adjacent each other;
wherein at least two strobe lines are positioned above and below each other; and
wherein the lines have generally rectangular cross-sections with a height and a width, the width being parallel in the planes of lines and being greater than the height.

10. A method of matching line impedances of lines in a data bus having strobe lines and data lines, the method comprising:
positioning strobe lines adjacent each other;
connecting strobe-line terminations to each of the strobe lines; and
connecting data-line terminations to each of a plurality of data lines, wherein the data-line terminations have an impedance value that is different than an impedance value of the strobe-line termination.

11. The method of claim 10, further comprising positioning data lines in a first plane with the strobe lines, wherein the strobe lines are positioned at a side of the first plane of lines.

12. The method of claim 11, further comprising:
positioning a conducting plane adjacent the first plane of lines; and
connecting the conducting plane to a ground or a source.

13. The method of claim 12, further comprising positioning a second plane of lines parallel to the conducting plane and the first plane of lines.

14. The method of claim 13, wherein the strobe lines are source-synchronous strobe lines that transition opposite each other periodically; and wherein the second plane of lines includes strobe lines positioned adjacent strobe lines in the first plane, at the side of the first plane.

15. A data bus with separate matched line impedances, comprising:
a first conducting plane;
a second conducting plane parallel to the first conducting plane;
a first plane of lines disposed between the first and second conducting planes, including data lines and at least two source-synchronous strobe lines positioned adjacent each other, wherein adjacent source-synchronous strobe lines transition opposite each other such that the adjacent source-synchronous strobe lines operate in odd mode;
a strobe-line termination connected to each of the strobe lines and having a value based on an impedance of the strobe lines; and
a data-line termination separate from the strobe-line termination, connected to each of the data lines, and having a value based on an impedance of the data lines.

16. The data bus of claim 15, further comprising a second plane of lines disposed between the first plane of lines and the second conducting plane, whereby the first and second planes of lines are adjacent each other, the second plane of lines including data lines and at least two strobe lines, the strobe lines in the second plane being positioned adjacent each other.

17. The data bus of claim 16, wherein the strobe lines in the second plane of lines are positioned adjacent the strobe lines in the first plane of lines.

18. The data bus of claim 15, wherein the first conducting plane is connected to a ground or a source.

19. The data bus of claim 15, wherein the source-synchronous strobe lines in the first plane of lines are positioned at a side of the first plane of lines.

20. An integrated circuit chip having separate terminations matched to line impedances of lines in a data bus, the chip comprising:
data-line inputs that receive data from a plurality of data lines in a bus;
strobe-line inputs that receive strobe signals from a plurality of strobe lines in the bus;
a data-line termination connected to the data-line inputs, having a value based on an impedance of the data lines; and
a strobe-line termination connected to the strobe-line inputs, having a value calculated based on an impedance of the strobe lines.

21. The integrated circuit of claim 20, wherein the data-line termination and the strobe-line termination have impedance values that are adjustable.

22. The integrated circuit of claim 20, wherein the data-line terminations and the strobe-line terminations are connected between the data-line inputs and the strobe-line inputs, respectively, and processing circuitry of the integrated circuit.

23. The integrated circuit of claim 20, wherein the strobe-line termination has a value based on an odd-mode impedance of the strobe lines.

* * * * *